(12) United States Patent
Koshiishi et al.

(10) Patent No.: US 7,816,768 B2
(45) Date of Patent: Oct. 19, 2010

(54) SEMICONDUCTOR DEVICE INCLUDING GROUND AND POWER-SUPPLY PLANES AND A DIELECTRIC LAYER BETWEEN THE GROUND AND POWER-SUPPLY PLANES

(75) Inventors: Kazutaka Koshiishi, Tokyo (JP); Mitsuaki Katagiri, Tokyo (JP); Satoshi Isa, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 306 days.

(21) Appl. No.: 12/007,758

(22) Filed: Jan. 15, 2008

(65) Prior Publication Data

US 2008/0173987 A1  Jul. 24, 2008

(30) Foreign Application Priority Data

Jan. 19, 2007  (JP) .............................. 2007-009802

(51) Int. Cl.
  *H01L 23/58*  (2006.01)
  *H01L 23/62*  (2006.01)
(52) U.S. Cl. ................. 257/665; 257/700; 257/E23.01; 361/762
(58) Field of Classification Search ................. 257/665, 257/700, E23.01; 361/762
See application file for complete search history.

(56) References Cited

U.S. PATENT DOCUMENTS

| 7,102,876 B2 * | 9/2006 | Lee et al. ..................... 361/312 |
| 7,385,286 B2 * | 6/2008 | Iwaki et al. .................. 257/724 |

FOREIGN PATENT DOCUMENTS

| JP | 06-302760 | * 10/1994 |
| JP | 7-335779 | 12/1995 |
| JP | 2000-183540 | 6/2000 |
| JP | 2001-111184 | 4/2001 |
| JP | 2003-60107 | 2/2003 |
| JP | 2005-129619 | 5/2005 |
| JP | 2006-140430 | 6/2006 |

OTHER PUBLICATIONS

Japaense Office Action dated Oct. 22, 2008 with partial English translation.

* cited by examiner

*Primary Examiner*—Howard Weiss
(74) *Attorney, Agent, or Firm*—McGinn IP Law Group PPLC (57) ABSTRACT

A high dielectric loss tangent layer is provided in a dielectric layer between a power-supply plane and a ground plane. The high dielectric loss tangent layer is arranged such that its edge is located between the edge of the power-supply plane and the edge of the ground plane. The edge of the high dielectric loss tangent layer is preferably separated by a predetermined distance or more from the edge of the power-supply plane or the edge of the ground plane which is located on the inner side.

15 Claims, 10 Drawing Sheets

SEMICONDUCTOR DEVICE INCLUDING GROUND AND POWER-SUPPLY PLANES AND A DIELECTRIC LAYER BETWEEN THE GROUND AND POWER-SUPPLY PLANES

This application is based upon and claims the benefit of priority from Japanese patent application No. 2007-009802, filed on Jan. 19, 2007, the disclosure of which is incorporated herein in its entirety by reference.

BACKGROUND OF THE INVENTION

1. Field of the Invention

The present invention relates to a semiconductor device, and in particular to a semiconductor device provided with a mounting board or a package substrate having a power-supply plane, a ground plane, and a dielectric layer disposed therebetween.

2. Description of the Related Art

Following recent increase in operation speed and reduction in power consumption of semiconductor devices, noise generated between the power supply and the ground of the mounting board or package substrate increases its effect on transmission of signals.

Simultaneous switching noise is referred to as an example of the noise generated between the power supply and the ground. The simultaneous switching noise has conventionally been addressed by enlarging the area of the power-supply plane or ground plane, or by mounting a bypass capacitor. However, the increase in operation speed of a semiconductor device results in reduced size and increased density of the semiconductor device. As a consequence, it is difficult to ensure a sufficient area for the power-supply plane and the ground plane or to arrange a required number of bypass capacitors. Therefore, other effective methods than these are required to reduce the noise between the power supply and the ground.

There is conventionally known a multi-layer wiring board capable of suppressing noise due to resonance of the power supply or ground plane. In such as board, an insulating layer formed of an insulating material having a high dielectric loss tangent is provided between a plane conductor for forming power supply wiring and another plane conductor for forming ground wiring (see, for example Japanese Laid-Open Patent Publication No. 2005-129619 (Patent Document 1)).

There is also known an electronic component in which a conduction noise inhibitor for suppressing conduction noise possibly causing radiation noise is arranged between a power supply layer and a ground layer of a multi-layer wiring board (see, for example, Japanese Laid-Open Patent Publication No. 2006-140430 (Patent Document 2)).

SUMMARY OF THE INVENTION

The semiconductor device technology has been progressed by further increasing the operation speed and reducing the power consumption of the semiconductor devices. This has exposed various problems, which have not been considered as problems before, including problems relating signal integrity (SI) and power integrity (PI). The SI relates to a transmission waveform quality during signal transmission in a semiconductor device. The SI ensures that digital signals having wide frequency components are transmitted without deterioration and with the transmission waveform quality being kept high. The PI ensures that the quality of power supply is kept high. When the power supply is not stable, it will cause insufficient power supply to signals connected to the power supply, disturbance in signal waveform, and generation of radiation noise.

Signal deterioration is caused by various factors, one of which is attenuation of signal waveform due to dielectric loss between a signal and the ground.

Figure 1A:
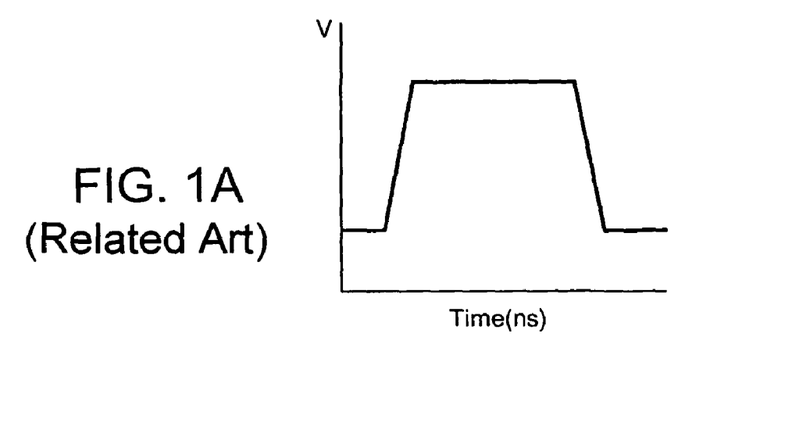
FIG. 1A is a waveform diagram showing an ideal signal waveform.
Figure 1B:
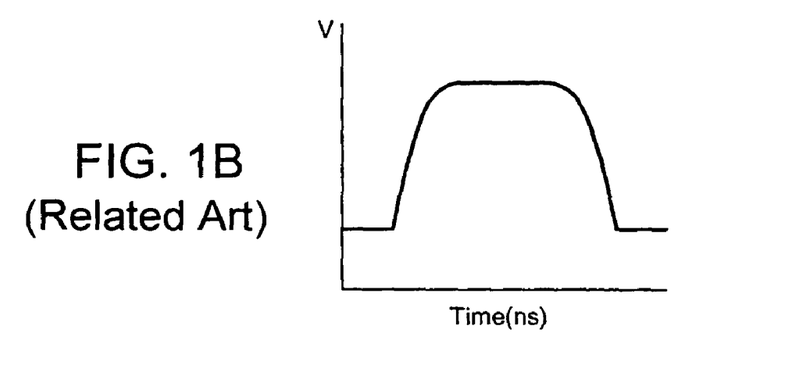
FIG. 1B is a waveform diagram showing a signal waveform affected by dielectric loss of a dielectric layer.
Figure 1C:
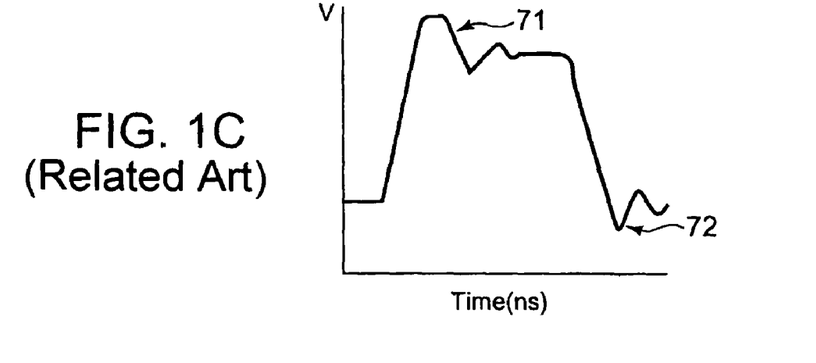
FIG. 1C is a waveform diagram showing a signal waveform when there is no dielectric loss of a dielectric material.

Referring to FIGS. 1A through 1C, deterioration in signal waveform and causes thereof will be described.

FIG. 1A shows an ideal signal waveform. This signal waveform is a rectangular (trapezoidal) waveform in which all of the rising and falling edges and the plateau representing the stable voltage state are drawn by straight lines.

FIG. 1B shows a signal waveform affected by dielectric loss. This signal waveform is a rectangular waveform the edges of which are rounded by being affected by dielectric loss. When such dielectric loss becomes greater, the aperture of an eye pattern will be made smaller, causing troubles in signal transmission. In order to avoid this, material manufacturers have been trying to develop materials having a low dielectric constant ($\in r$) or those having a low dielectric loss (tan $\delta$), while semiconductor or substrate manufacturers have been using such materials having a low dielectric constant or low dielectric loss.

However, when the dielectric loss is too low, the behavior of the signal waveform becomes more notable, and the possibility is increased of occurrence of ringing (multiple reflections due to impedance mismatching occurring during connection of transmission lines or components) or overshoot and undershoot noise in signal wiring.

FIG. 1C shows a signal waveform when the dielectric loss is low. An overshoot 71 is observed after the rising of the signal and an undershoot 72 is observed after the falling. The overshoot and undershoot are generated as a result of a signal output from a driver instantaneously exceeding a normal high or low level during rising or falling. The signal waveform is also deteriorated by such overshoot or undershoot, making the normal signal transmission impossible.

On the other hand, there are problems such as simultaneous switching noise in power supply devices. Description will be made of simultaneous switching noise with reference to FIG. 2.

Figure 2:
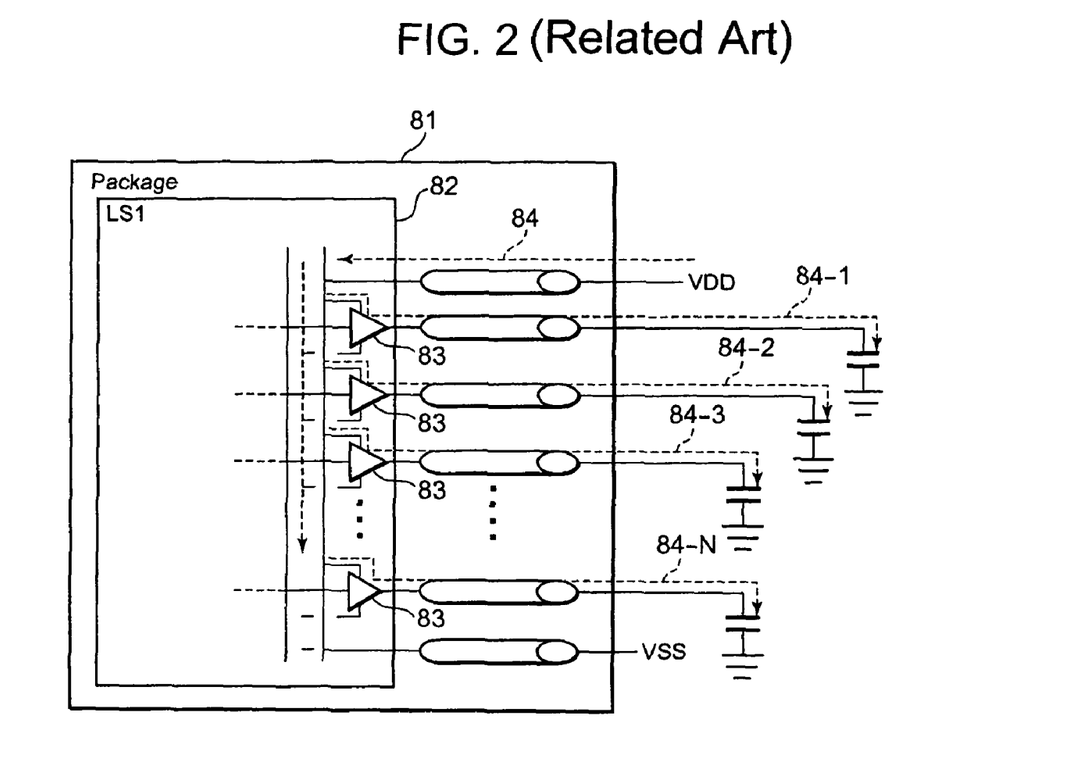
FIG. 2 is a circuit diagram for explaining simultaneous switching noise.

An LSI 82 accommodated in a package 81 is supplied with power through VDD and VSS. When a driver 83 contained in the LSI 82 is switched over, a current 84 flows as indicated by the broken line arrow. When all the drivers 83 are switched over simultaneously, currents 84-1 to 84-N flows simultaneously. This means that a large current flows from VDD to VSS at this time. As a result, potential variation occurs in VDD and VSS, resulting in generation of noise. This is called simultaneous switching noise. This problem has conventionally been addressed by enlarging the area of the power-supply plane or ground plane, but this method has become impossible due to the increased density caused by reduction of the size of semiconductor devices.

Figure 3:
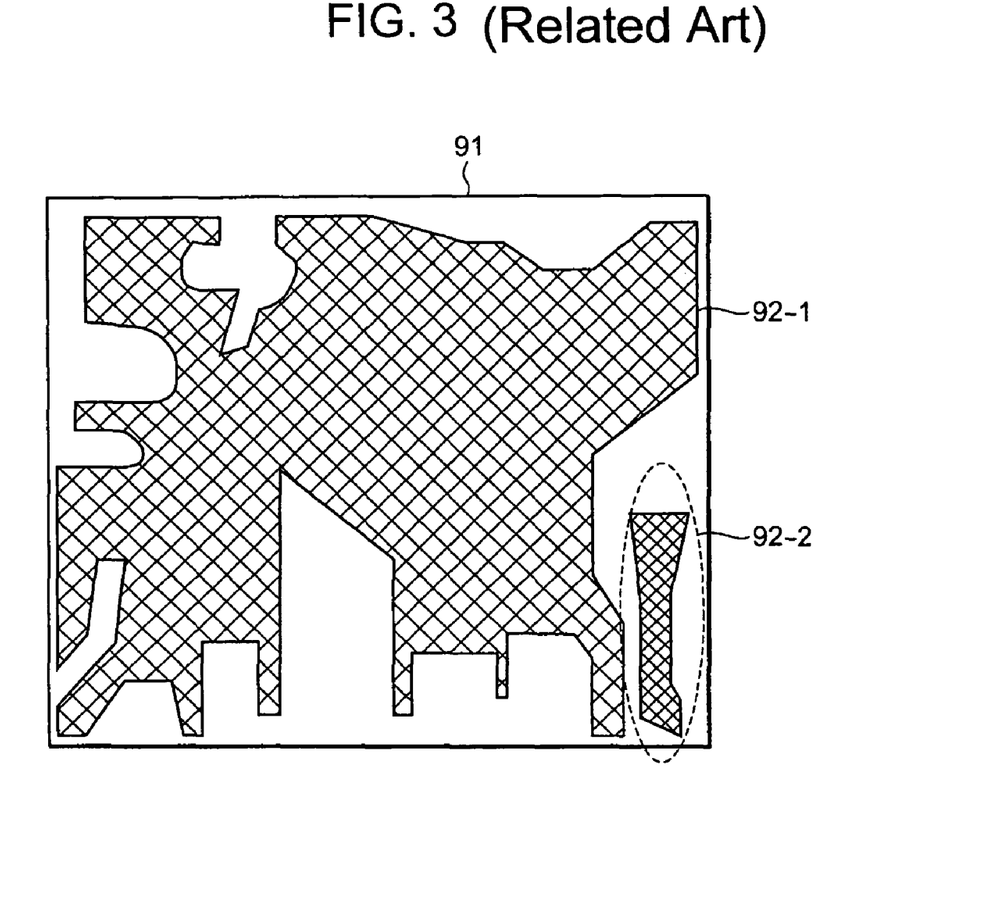
FIG. 3 is a plan view for explaining shapes of a ground plane and a power-supply plane.

FIG. 3 shows an example of shapes of power-supply and ground planes of a semiconductor device having a reduced size and increased density. In this example, the ground plane 91 has a rectangular shape, while the power-supply planes 92-1 and 92-2 are separated from each other and have complicated shapes. The power-supply planes 92-1 and 92-2 are separated from each other because the increased wiring density makes it necessary to lay signal wiring and ground wiring on the power supply layer. A power-supply plane having an island shape like the power-supply plane 92-2 cannot ensure a sufficient power supply capacity. Therefore, a large noise tends to be generated when a plurality of drivers connected to the power-supply plane 92-2 are operated simultaneously.

Thus, the increased operation speed, reduced size and increased density of semiconductor devices have make it difficult to ensure sufficient area for the power-supply plane and the ground plane or to arrange a sufficient number of bypass capacitors.

Although improvement in SI and PI can be expected according to the techniques described in Patent Documents 1 and 2 above, both of these techniques are used for the power-supply plane which is a solid plane. If these techniques are directly applied to a semiconductor device having signal wiring laid on its power supply layer, problems will be incurred that signals are attenuated, and the noise between the power-supply and ground planes cannot be suppressed sufficiently.

It is therefore an object of the present invention to provide a semiconductor device which is capable of effectively suppressing the simultaneous switching between the power supply and the ground and satisfying the requirements of signal integrity and power integrity even if not only power-supply and ground planes but also signal wiring are provided on a power supply layer or a ground layer.

The present invention provides a semiconductor device including a substrate having a ground plane and a power-supply plane arranged to face each other with a dielectric layer interposed therebetween, the edge of the ground plane being offset from the edge of the power-supply plane in a direction orthogonal to a thickness direction. In this semiconductor device, a high dielectric loss tangent layer having a higher tan δ than the periphery is provided in the dielectric layer between the edge of the ground plane and the edge of the power-supply plane in the direction orthogonal to the thickness direction, and the edge of the high dielectric loss tangent layer located outside with respect to the direction orthogonal to the thickness direction is positioned between the edge of the ground plane and the edge of the power-supply plane in the direction orthogonal to the thickness direction.

In the semiconductor device, the edge of the high dielectric loss tangent layer may be separated by a predetermined distance or more from the edge of the ground plane or the edge of the power-supply plane which is located on the inner side in the direction orthogonal to the thickness direction. For example, the predetermined distance may be set to 0.8d where d denotes a thickness of the dielectric layer. Further, the predetermined distance may be set to a greater value as the tan δ of the high dielectric loss tangent layer becomes greater.

Further, in the semiconductor device, the high dielectric loss tangent layer may be arranged closer, in the thickness direction, to the ground plane or the power-supply plane which has an edge located on the inner side in the direction orthogonal to the thickness direction.

Further, in the semiconductor device, the tan δ of the high dielectric loss tangent layer may be set to 0.2 or higher.

According to the present invention, a semiconductor includes a substrate having a ground plane and a power-supply plane arranged to face each other with a dielectric layer interposed therebetween, the edge of the ground plane being offset from the edge of the power-supply plane in a direction orthogonal to a thickness direction. In the semiconductor device, a high dielectric loss tangent layer having a higher tan δ than the periphery is arranged in the dielectric layer between the edge of the ground plane and the edge of the power-supply plane in the direction orthogonal to the thickness direction, and the edge of the high dielectric loss tangent layer located outside with respect to the direction orthogonal to the thickness direction is positioned between the edge of the ground plane and the edge of the power-supply plane in the direction orthogonal to the thickness direction. This configuration makes it possible, even if signal wiring is located in the power supply layer or the ground layer, to efficiently suppress the simultaneous switching noise without attenuating signals propagated on the signal wiring, and to satisfy the requirements of signal integrity and power integrity.

DETAILED DESCRIPTION OF THE INVENTION

A preferred embodiment of the present invention will be described with reference to the accompanying drawings.

Figure 4:
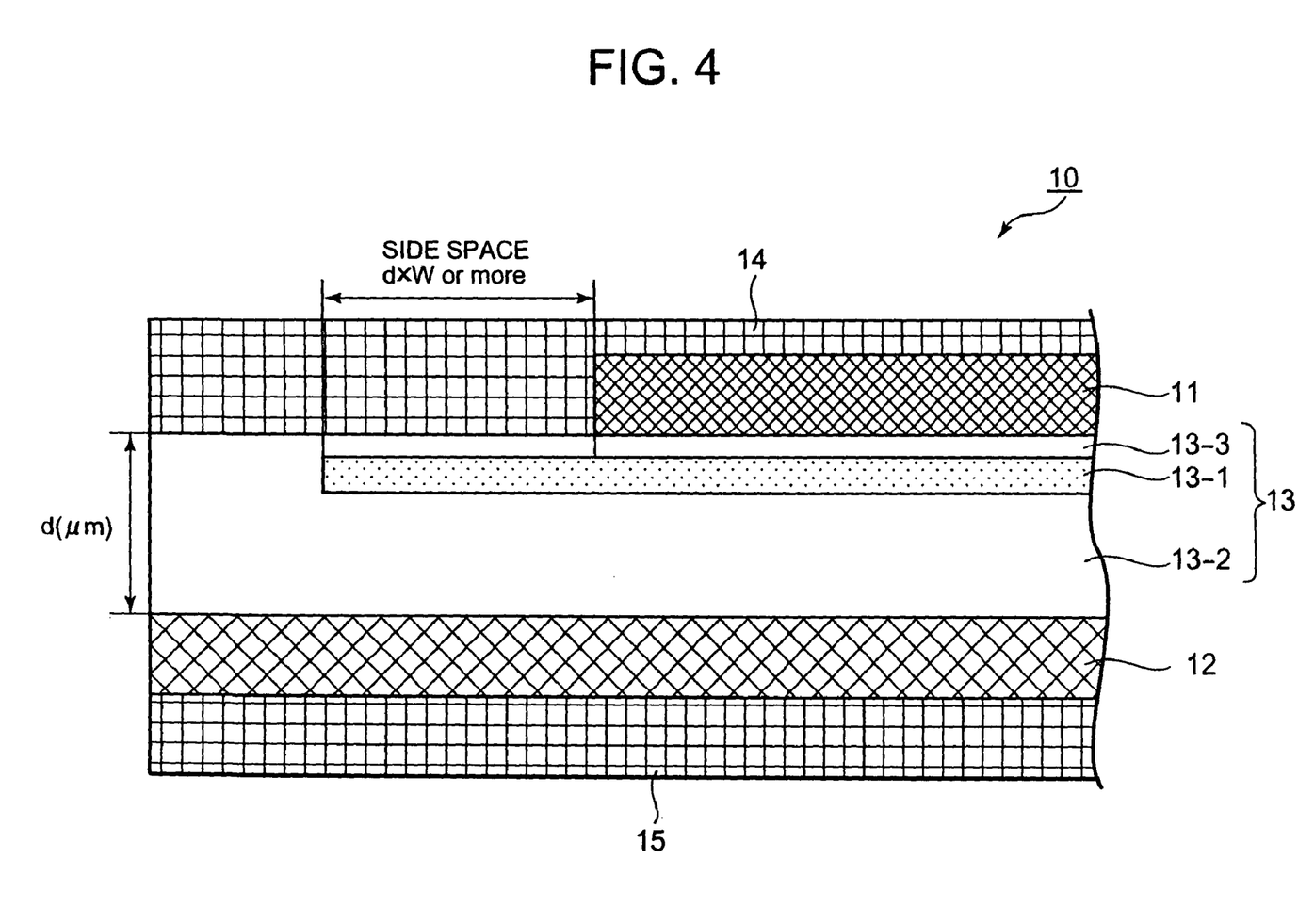
FIG. 4 is a cross-sectional view showing a structure of a substrate for use in a semiconductor device according to a first embodiment of the present invention.

FIG. 4 is a partial cross-sectional view showing a structure of a substrate 10 for use in a semiconductor device according to an embodiment of the present invention.

As shown in FIG. 4, a power-supply plane (power supply layer) 11 and a ground plane (GND layer) 12 are arranged to face each other across a dielectric layer 13. The power-supply plane 11 and the ground plane 12 are made of copper (Cu), for example, and their surfaces are covered with solder resist layers 14 and 15, respectively.

The plan shape (a shape as viewed from above) of the ground plane 12 is rectangular, for example. Unlike the ground plane 12, the power-supply plane 11 has an island-like or complicated shape with slits or the like. Therefore, the edge of the power-supply plane 11 is located on the inner side (right side in the drawing) than the edge of the ground plane 12 in a direction orthogonal to a thickness direction (lateral direction in the drawing).

The dielectric layer 13 has a three-layer structure in which a high dielectric loss tangent layer (high tan δ layer) 13-1 is sandwiched between normal dielectric loss tangent (normal tan δ) layers 13-2 and 13-3. If the upper surface of the high dielectric loss tangent layer 13-1 has insulating properties, the provision of the normal dielectric loss tangent layer 13-3 is not necessarily required.

The normal dielectric loss tangent layers 13-2 and 13-3 are made of a known material for printed wiring boards, for example of FR4 (with tan δ of about 0.02 to 0.03). The normal dielectric loss tangent layers 13-2 and 13-3 have a thickness of several μm to several tens of μm, for example.

The high dielectric loss tangent layer 13-1 is made of a composite material obtained by mixing metal or carbon particles in an organic resin such as phenol resin (with a tan δ of about 0.05 to 0.1) or polyvinyl chloride resin. The tan δ of such composite material can be changed by adjusting the composition thereof. Herein, it is adjusted to be equal to higher than 0.2. The high dielectric loss tangent layer 13-1 has a thickness of several nm to several tens of nm, much smaller than that of the normal dielectric loss tangent layer 13-2 or 13-3.

The high dielectric loss tangent layer 13-1 may be formed by using SPINPEDA (trade name) manufactured by Shin-Etsu Polymer Co., Ltd. SPINPEDA is made by forming a noise suppression layer (a magnetic metal layer with a thickness of about 20 nm) on the surface of a base (e.g., a polyimide film) with a binder layer interposed therebetween. SPINPEDA has a property to rapidly increase the transmission loss of an adjacent signal line (to attenuate S21) at a high frequency.

The high dielectric loss tangent layer 13-1 is arranged such that at least a part thereof is located between the edge of the power-supply plane 11 and the edge of the ground plane 12 with respect to a direction orthogonal to the thickness direction (lateral direction in the drawing). The part of the high dielectric loss tangent layer 13-1 located directly below the power-supply plane 11 or the ground plane 12 (the power-supply plane 11 in this embodiment) the edge of which is located on the inner side (the right side in the drawing) in the direction orthogonal to the thickness direction may be provided or may not be provided according to a property required for the layer. Further, the high dielectric loss tangent layer 13-1 is arranged such that the edge thereof located on the outer side (the left side in the drawing) with respect to the direction orthogonal to the thickness direction is located between the edge of the power-supply plane 11 and the edge of the ground plane 12 with respect to the direction orthogonal to the thickness direction (the lateral direction in the drawing). In the following description, the distance from the edge of the power-supply plane 11 to the edge of the high dielectric loss tangent layer 13-1 (the distance in the direction orthogonal to the thickness direction) is referred to as the side space. As described later, the side space is set to be d×W or more, according to a thickness d of the dielectric layer 13.

Further, the position of the high dielectric loss tangent layer 13-1 in the thickness direction (the vertical direction in the drawing) is closer to the power-supply plane 11 or the ground plane 12 the edge of which is located in the inner side in the direction orthogonal to the thickness direction (the lateral direction in the drawing). Since the edge of the power-supply plane 11 is located on the inner side than the edge of the ground plane 12 in this embodiment, the high dielectric loss tangent layer 13-1 is located closer to the power-supply plane 11. The high dielectric loss tangent layer 13-1 can be positioned closer to either the power-supply plane 11 or the ground plane 12 by setting the thickness of the normal dielectric loss tangent layer 13-2 or 13-3 to a desired value. It is also possible to use a combination of commercially available dielectric material films having different thicknesses in view of the cost effectiveness.

Figure 5A:
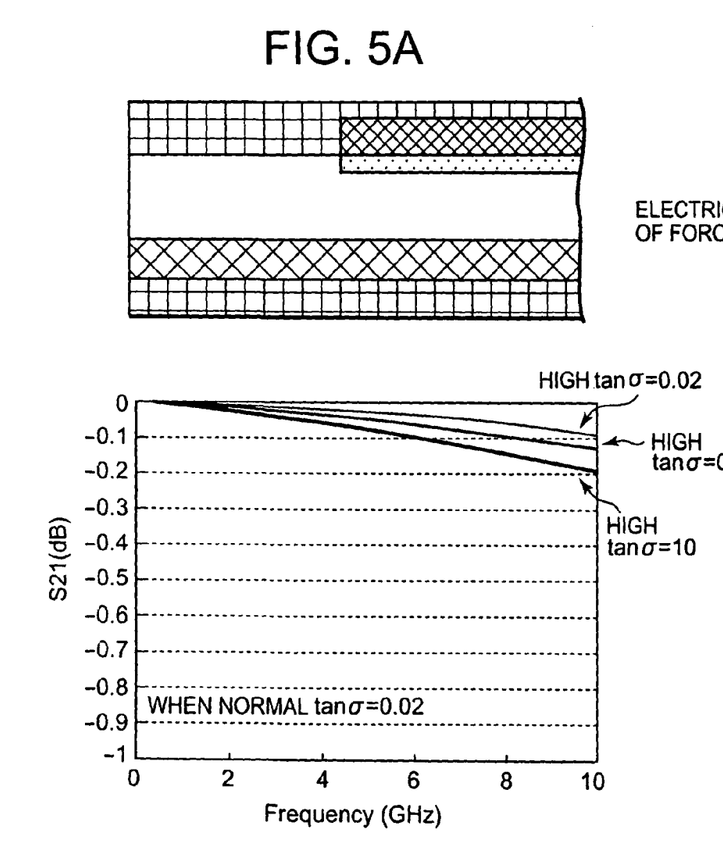
FIG. 5A is a graph showing the transmission loss (S21) of the power-supply plate obtained by electromagnetic field simulation when there is no side space in the high dielectric loss tangent layer of the substrate shown in FIG. 3.
Figure 5B:
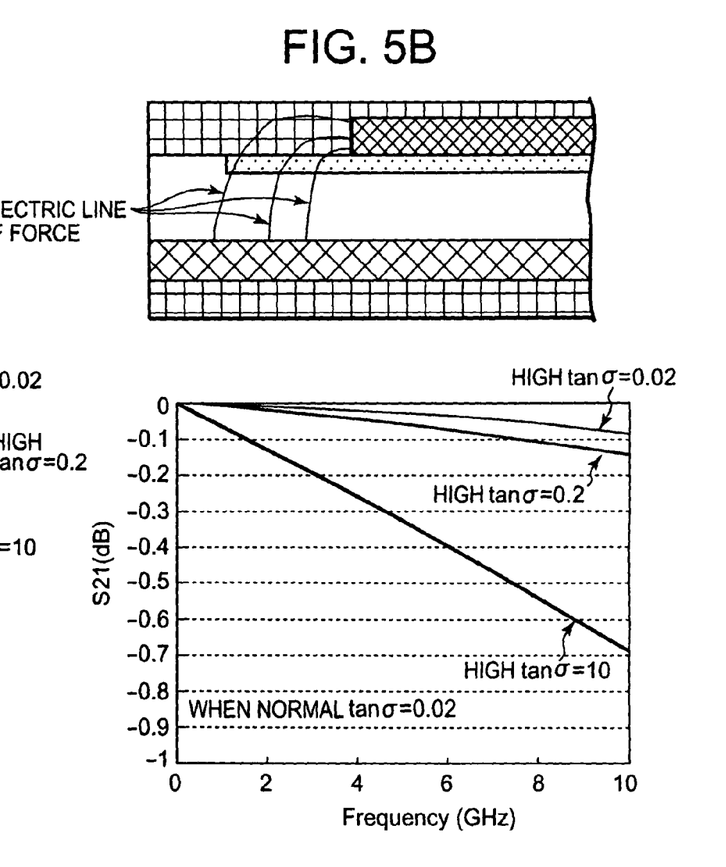
FIG. 5B is a graph showing the transmission loss (S21) of the power-supply plate obtained by electromagnetic field simulation when there is a side space in the high dielectric loss tangent layer of the substrate shown in FIG. 3.

FIGS. 5A and 5B show transmission loss (S21) of the power-supply plate obtained by electromagnetic field simulation for the cases in which there is no side space and there is a side space, respectively. The dielectric layer 13 used in this simulation was composed of the high dielectric loss tangent layer 13-1 and the normal dielectric loss tangent layer 13-2 and no normal dielectric loss tangent layer 13-3 was included therein.

The simulation used a model in which both the power-supply plane 11 and the ground plane 12 were formed of copper (with a conductivity of $5.8 \times 10^7$ (S/m) and a permeability of 1 (H/m)). The power-supply plane 11 had a size of 1 mm×0.2 mm×0.02 mm (length×width×height), and the ground plane 12 had a size of 1 mm×1 mm×0.02 mm (length×width×height). The normal dielectric loss tangent layer 13-2 had a size of 1 mm×1 mm×0.05 mm (length×width×height), with a dielectric constant of 3.4 and a tan δ of 0.02. Further, the high dielectric loss tangent layer 13-1 had a size of 1 mm×0.2 mm×0.05 mm (length×width×height) of a size of 1 mm×0.24 mm×0.05 mm (length×width×height), with a dielectric constant of 3.4 and a tan δ of 0.02, 0.2, or 10. Analysis was conducted using ANSOFT's high-frequency 3D electromagnetic simulator HFSS, in an analysis frequency range of 50 MHz to 10 GHz.

As is clearly understood from FIGS. 5A and 5B, a greater noise suppression effect can be obtained as the tan δ of the high dielectric loss tangent layer 13-1 is increased. Further, as is obvious from comparison between FIG. 5A and FIG. 5B, the noise suppression effect is greater when there is a side space than when there is no side space. This is because, when there is a side space, more electric lines of force generated between the power-supply plane 11 and the ground plane 12 pass through the high dielectric loss tangent layer 13-1. As is also seen from the comparison between FIG. 5A and FIG. 5B, the high dielectric loss tangent layer 13-1 need not necessarily be provided directly below the power-supply plane 11 if a sufficient noise suppression effect can be obtained by the presence of the side space.

Figure 6:
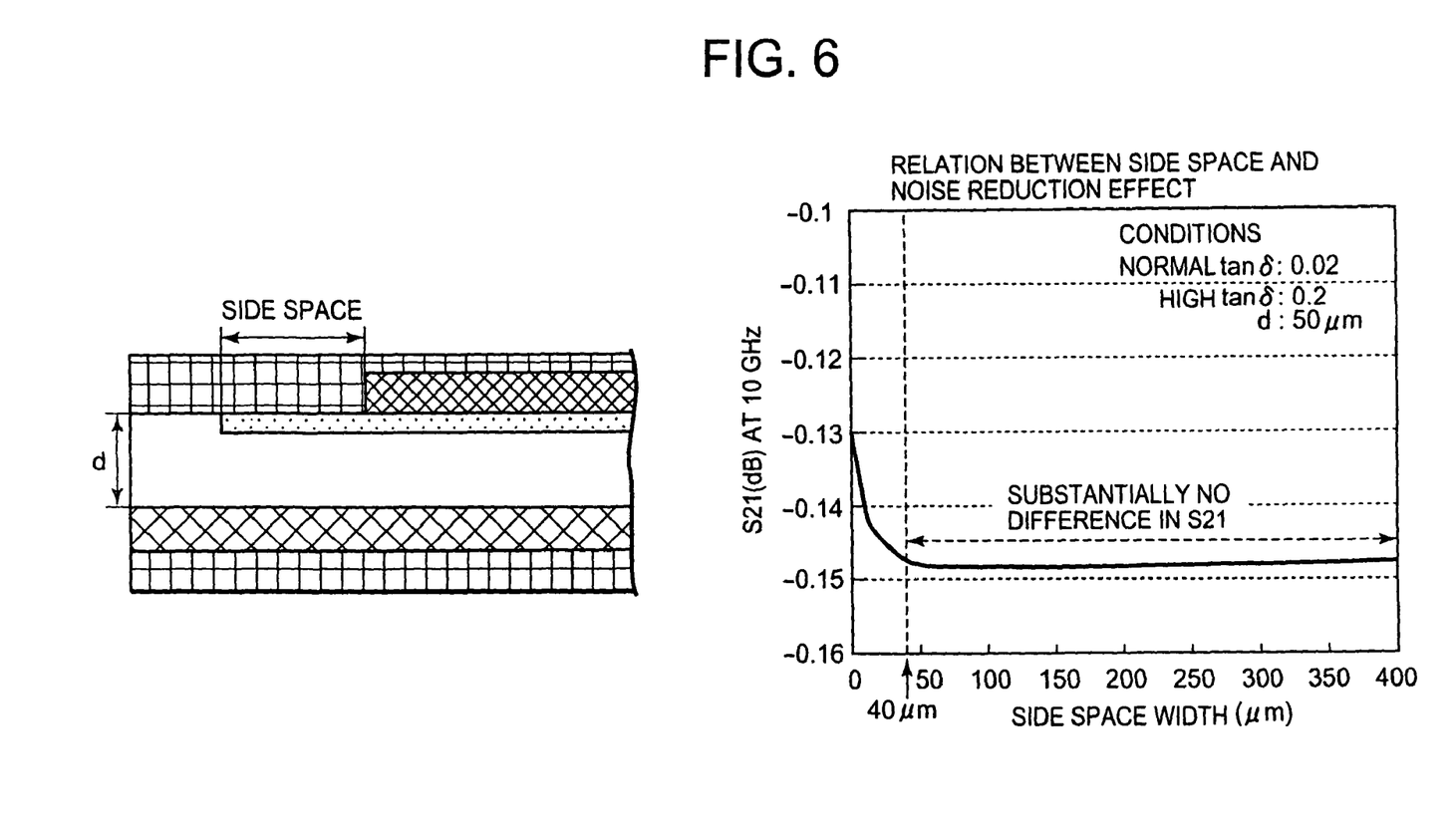
FIG. 6 is a graph showing relationship between the width of the side space of the high dielectric loss tangent layer and the transmission loss (S21) of the power-supply plate in the substrate shown in FIG. 3, obtained by electromagnetic field simulation.

FIG. 6 shows relation between width of the side space and transmission loss (S21) of the power-supply plate obtained by electromagnetic field simulation. The frequency of signals propagated through the power-supply plate was set to 10 GHz.

As is obvious from FIG. 6, the noise suppression effect is increased (S21 is reduced) along with the increase in width of the side space until the width of the side space reaches a specific value (40 μm herein). However, the noise suppression effect becomes substantially constant after the value of the side space width exceeds the specific value. Therefore, the width of the side space must be equal to or greater than the specific value so that the maximum of the noise suppression effect can be obtained by the provision of the high dielectric loss tangent layer 13-1.

Figure 7:
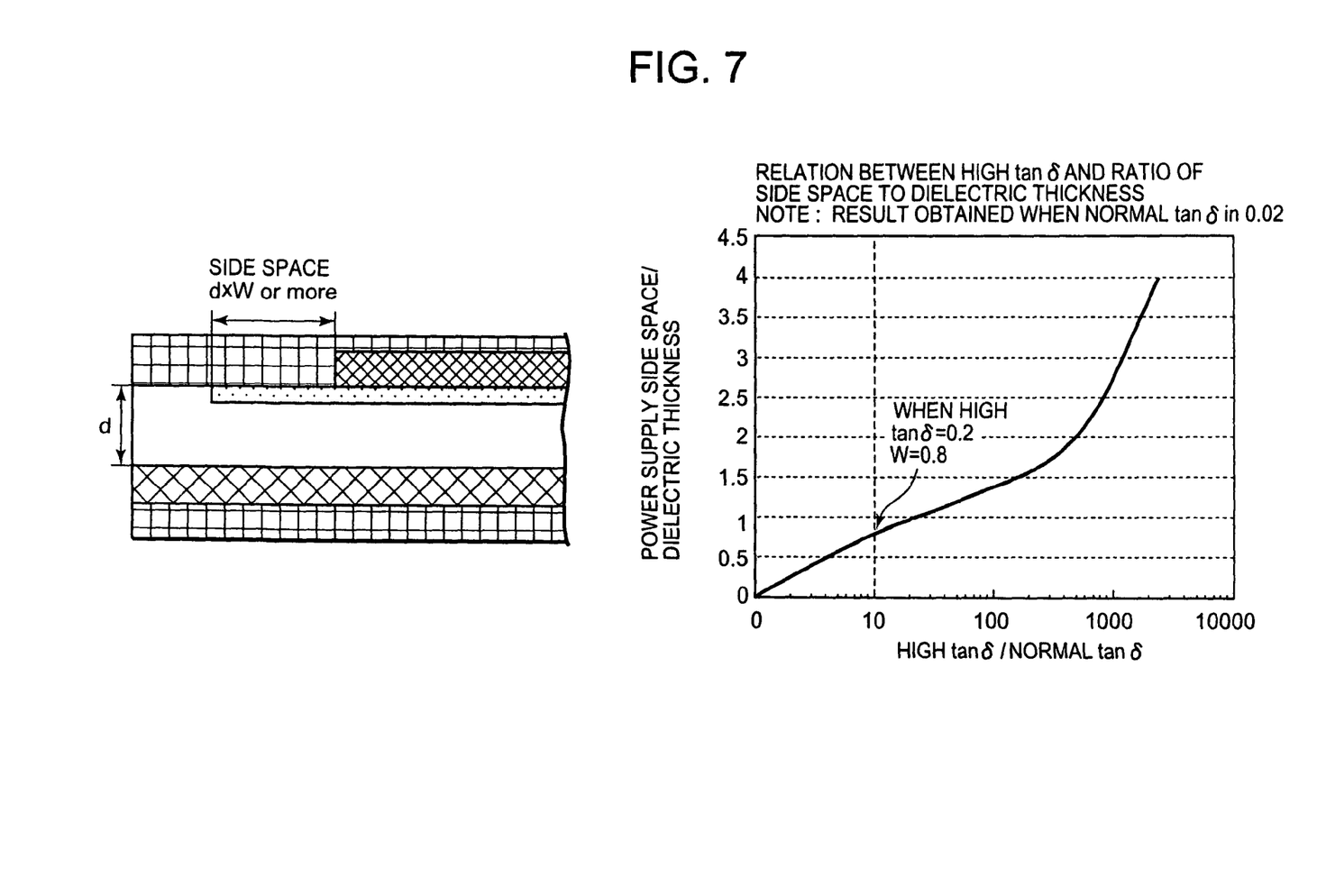
FIG. 7 is a graph showing relationship between tan δ of the high dielectric loss tangent layer and the ratio W of side space width to thickness d of the dielectric layer in the substrate shown in FIG. 3.

FIG. 7 shows relation between ratio W of the side space width to the thickness d of the dielectric layer and tan δ of the high dielectric loss tangent layer 13-2. The side space d×W is set to a value at which the noise suppression effect is saturated (the above-mentioned specific value, or a value depending on tan δ). The tan δ of the normal dielectric loss tangent layer 13-2 is set to 0.02.

As is obvious from FIG. 7, the ratio W of the side space becomes greater as the tan δ of the high dielectric loss tangent layer 13-1 is increased. This means that side space d×W must be greater as the tan δ of a material used for the high dielectric loss tangent layer 13-1 is increased. For example, in case where the normal dielectric loss tangent layer 13-2 has a tan δ of 0.02, the ratio W of the side space is 0.8, 1.2, 2 and 4, respectively, when the tan δ of the high dielectric loss tangent layer 13-2 is 0.2, 1, 10 and 50.

Figure 8A:
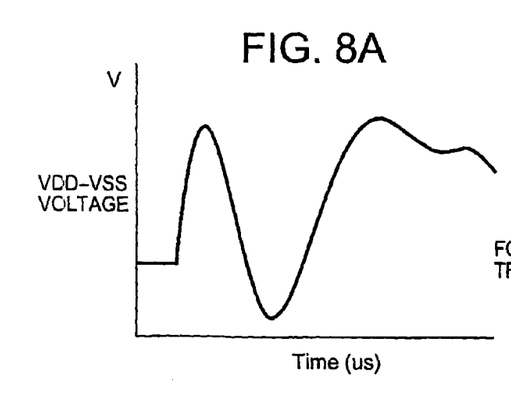
FIG. 8A is a waveform diagram showing variation with time of the noise generated between the power-supply plane and ground planes when an ordinary dielectric layer is disposed between the power-supply and ground planes and the driver is driven at an operating frequency of 1 GHz.

FIG. 8A is a graph illustrating changes with time of the waveform of noise (voltage) generated between the power supply and the ground when the dielectric layer 13 is formed only by the normal dielectric loss tangent layer 13-2 (of FR4 with a tan δ of 0.02), and a driver (not shown) connected to the power-supply plane 11 and the ground plane 12 is driven at an operating frequency of 1 GHz.

Figure 8B:
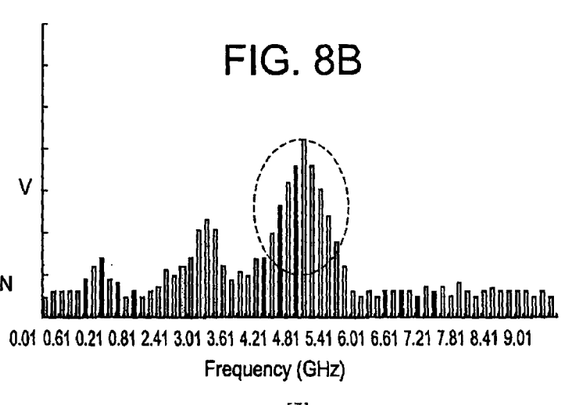
FIG. 8B is a graph obtained by Fourier transforming FIG. 8A.

FIG. 8B is a graph obtained by Fourier transforming the waveform of voltage variation shown in FIG. 8A into frequency components. As seen from FIG. 8B, noise is principally composed of the operating frequency of 1 GHz and its harmonic components, and there are especially many components around 5 GHz as indicated by the broken line.

Figure 8C:
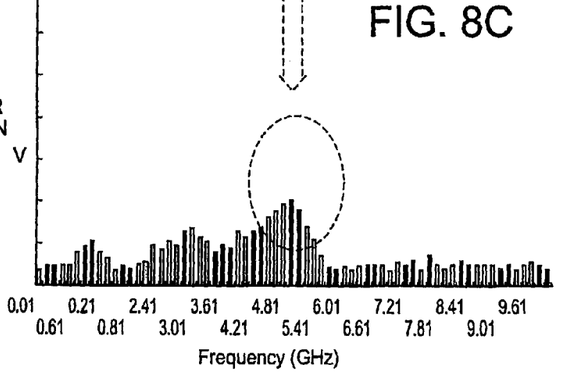
FIG. 8C is a graph showing frequency components of the noise generated between the power-supply and ground planes when using the substrate of FIG. 4 and driving the driver at an operating frequency of 1 GHz.

FIG. 8C is a graph illustrating frequency components of noise (voltage) generated between the power supply and the ground when a driver (not shown) connected to the power-supply plane 11 and the ground plane 12 is driven at an operating frequency of 1 GHz, using a substrate 10 having the structure shown in FIG. 1. As is obvious when comparing FIG. 8C with FIG. 8B, the generation of noises is suppressed when using the substrate 10 according to the present embodiment in which the high dielectric loss tangent layer 13-1 is provided in the dielectric layer 13. Reduction of 5-GHz components as harmonic waves of the operating frequency is particularly notable.

Figure 8D:
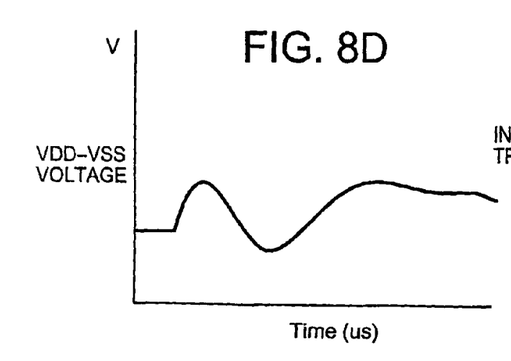
FIG. 8D is a waveform diagram obtained by inversely Fourier transforming FIG. 8C.

FIG. 8D is a graph obtained by inversely Fourier transforming the graph of FIG. 8C, and illustrates changes with time of the waveform of the noise. Comparing FIG. 8D with FIG. 8A, it can be seen that the voltage amplitude of the noise between the power supply and the ground has become smaller, and thus the noise has been reduced. This is because the transmission loss is increased (S21 is reduced) in the power-supply plane 11 by the action of the high dielectric loss tangent layer 13-1 provided in the dielectric layer 13, and the high-frequency noise components generated during high speed operation of the device are converted to heat or the like. Such noise reduction effect can be obtained as well by using SPINPEDA as a material for the high dielectric loss tangent layer 13-1, since similar effects can be obtained as long as the transmission loss is high (S21 is low).

As is obvious from the description above, the current noise flowing through the power-supply plane 11 is composed of a wide range of frequency components from relatively low frequency components to high frequency components (from the simultaneous switching noise to its harmonic waves), and the noise tends to become higher as the frequency becomes higher. On the other hand, the transmission loss caused by the high dielectric loss tangent layer 13-1 provided between the power-supply plane 11 and the ground plane 12 is increased (S21 is reduced) as the frequency becomes higher (see FIG. 5). This enables the semiconductor device using the substrate 10 according to the embodiment of the present invention to effectively reduce a wide frequency range of noise from low frequency noise to high frequency noise (see FIG. 8D).

The high dielectric loss tangent layer 13-1 need not be formed over the entire surface, but can be formed such that its edge is away from the edge of power-supply plane 11 by a predetermined distance. Accordingly, the attenuation of signals propagated on signal wiring provided on the power supply layer can be prevented by arranging the signal wiring at a position away from the high dielectric loss tangent layer 13-1.

Figure 9:
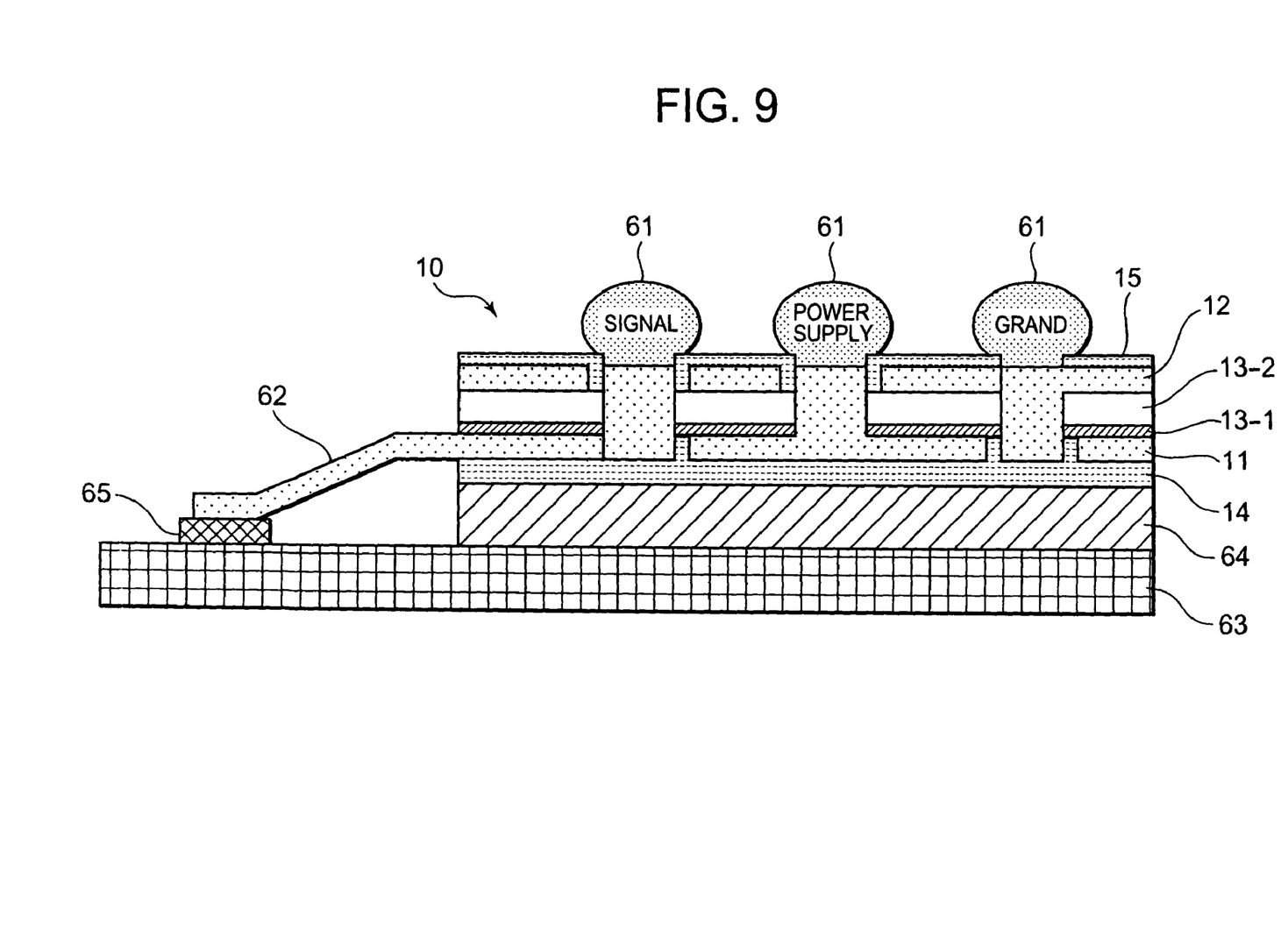
FIG. 9 is a partial cross-sectional view showing an example of a structure of a semiconductor device using the substrate shown in FIG. 3.

FIG. 9 shows an example of a semiconductor device using the substrate 10 of FIG. 4. As shown in the figure, the substrate 10 has solder balls 61 and a lead-out wire 62. A semiconductor chip 63 is bonded to the substrate 10 by means of an elastomer 64, for example. An Al pad 65 formed on the semiconductor chip 63 is connected to the lead-out wire 62.

According to FIG. 9, the power-supply plane 11 and a signal wiring layer are formed in a same layer, and the signal wiring is connected to the Al pad 65 on the semiconductor chip 63. Like the signal wiring layer, the power-supply plane 11 and the ground plane 12 are respectively connected to other Al pads on the semiconductor chip 63 by means of lead-out wires (not shown).

Although the present invention has been described on the basis of a preferred embodiment, the present invention is not limited to the embodiment described above but may be variously modified. For example, although a high dielectric loss tangent layer is used in the embodiment described above, any other layer may be used as long as it has an equivalent effect to that of the high dielectric loss tangent layer, that is, it is able to increase the transmission loss (to reduce S21), or it exhibits the noise reduction effect over a frequency range from the operating frequency of the semiconductor device to a frequency range higher than that.

Figure 10:
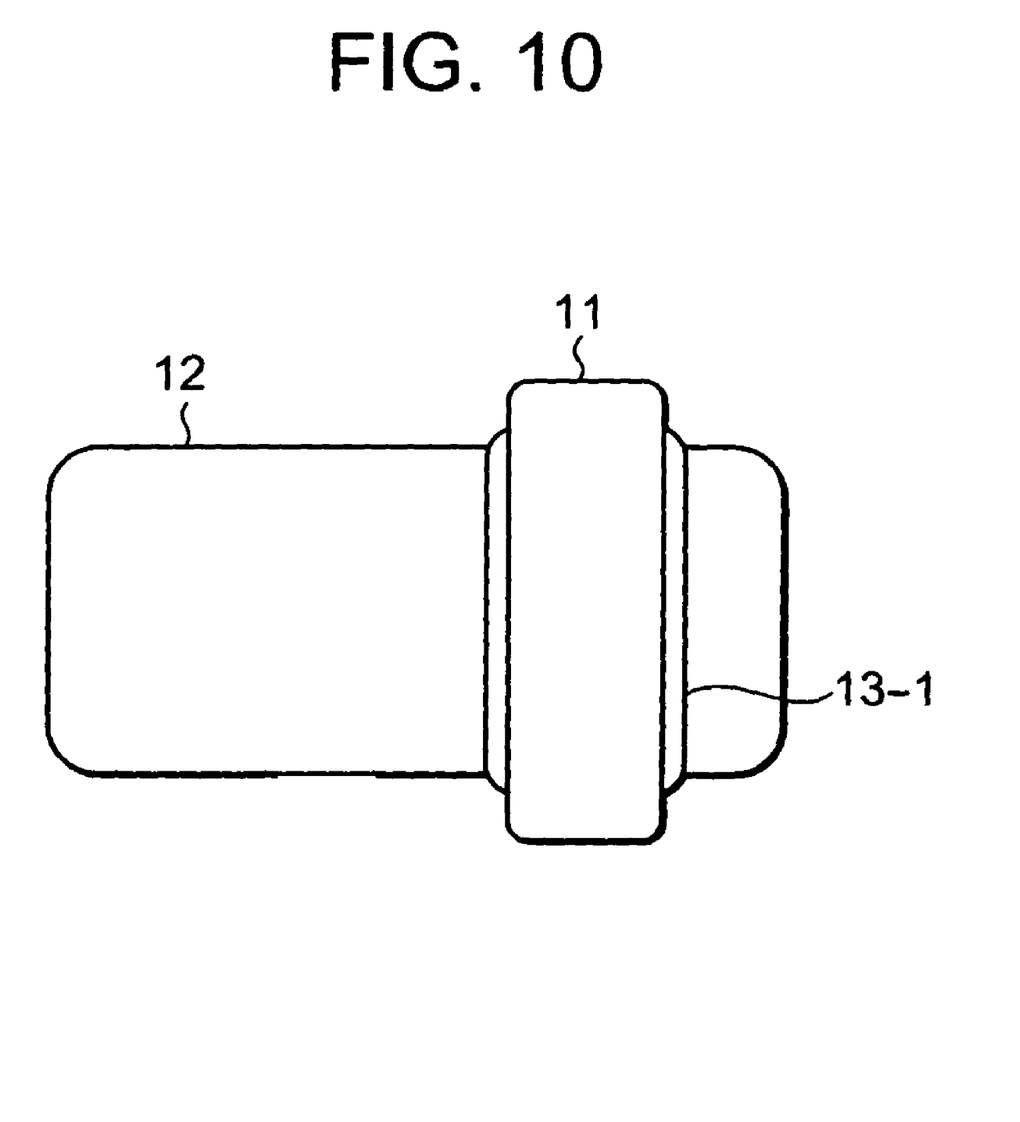
FIG. 10 is a diagram showing an example of arrangement of a high dielectric loss tangent layer when a part of an edge of the power-supply plane is positioned outside an edge of the ground plane.

Further, the power-supply plane and the ground plane may take various shapes. Therefore, the edge of one of these planes is not necessarily be located on the inner side than the edge of the other plane. This means that a part of the edge of one of the planes is located on the inner side than the edge of the other plane, while the other part is located on the outer side. In such a case, the high dielectric loss tangent layer 13-1 may be provided such that the edge of the high dielectric loss tangent layer 13-1 is located on the outer side than the edge of one of the planes having a greater part of the edge located on the inner side. For example, when the power-supply plane 11 and the ground plane 12 are in the positional relationship as shown in FIG. 10, the high dielectric loss tangent layer 13-1 may be arranged such that the edge of the high dielectric loss tangent layer 13-1 is located on the outer side at least in a region where the edge of the power-supply plate 11 is located on the inner side.

What is claimed is:
1. A semiconductor device, comprising:
  a substrate having a ground plane and a power-supply plane arranged to face each other with a dielectric layer interposed between the ground plane and the power-supply plane, an edge of the ground plane being offset from an edge of the power-supply plane in a direction orthogonal to a thickness direction,
  wherein a high dielectric loss tangent layer having a higher tan δ than a periphery is provided in the dielectric layer between the edge of the ground plane and the edge of the power-supply plane in the direction orthogonal to the thickness direction, and an edge of the high dielectric loss tangent layer located outside one of the ground plane and the power-supply plane in the direction orthogonal to the thickness direction is positioned between the edge of the ground plane and the edge of the power-supply plane in the direction orthogonal to the thickness direction.

2. The semiconductor device according to claim 1, wherein the edge of the high dielectric loss tangent layer is located outside of the power-supply plane in the direction orthogonal to the thickness direction and is separated by a predetermined distance or more from the edge of the power-supply plane in the direction orthogonal to the thickness direction.

3. The semiconductor device according to claim 2, wherein the predetermined distance is set to 0.8d where d denotes a thickness of the dielectric layer.

4. The semiconductor device according to claim 2, wherein the predetermined distance is set to a greater value as the tan δ of the high dielectric loss tangent layer becomes greater.

5. The semiconductor device according to claim 1, wherein the edge of the ground plane is located outside the edge of the power-supply plane in the direction orthogonal to the thickness direction, and the high dielectric loss tangent layer is arranged closer, in the thickness direction, to the power-supply plane.

6. The semiconductor device according to claim 1, wherein the tan δ of the high dielectric loss tangent layer is set to 0.2 or higher.

7. The semiconductor device according to claim 1, wherein the edge of the high dielectric loss tangent layer is located outside of the ground plane in the direction orthogonal to the thickness direction and is separated by a predetermined distance or more from the edge of the ground plane in the direction orthogonal to the thickness direction.

8. The semiconductor device according to claim 1, wherein the edge of the ground plane is located outside the edge of the power-supply plane in the direction orthogonal to the thickness direction.

9. A substrate for a semiconductor device, comprising:
a power-supply plane;
a ground plane including an edge which is offset from an edge of the power-supply plane in a direction orthogonal to a thickness direction of the substrate; and
a dielectric formed between the ground plane and the power-supply plane, and including:
a high dielectric loss tangent layer including an edge which is formed outside one of the ground plane and the power-supply plane in the direction orthogonal to the thickness direction and between the edge of the ground plane and the edge of the power-supply plane in the direction orthogonal to the thickness direction; and
an other layer which is formed outside of the high dielectric loss tangent layer in the direction orthogonal to the thickness direction, and includes a tan δ which is less than a tan δ of the high dielectric loss tangent layer.

10. The substrate according to claim 9, wherein the edge of the high dielectric loss tangent layer is located outside of the power-supply plane in the direction orthogonal to the thickness direction and is separated by a predetermined distance from the edge of the power-supply plane in the direction orthogonal to the thickness direction.

11. The substrate according to claim 9, wherein the other layer of the dielectric is formed between the ground plane and the high dielectric loss tangent layer and between the power-supply plane and the high dielectric loss tangent layer.

12. The substrate according to claim 9, wherein the other layer of the dielectric is formed between the ground plane and the high dielectric loss tangent layer.

13. The substrate according to claim 9, wherein the edge of the high dielectric loss tangent layer is formed outside the power-supply plane in the direction orthogonal to the thickness direction, and the power-supply plane is formed on a surface of the high dielectric loss tangent layer.

14. The substrate according to claim 9, further comprising:
a first solder resist layer formed on a side of the power-supply plane which is opposite the dielectric; and
a second solder resist layer formed on a side of the ground plane which is opposite the dielectric.

15. The substrate according to claim 14, wherein the edge of the high dielectric loss tangent layer is formed outside the power-supply plane in the direction orthogonal to the thickness direction, and the first solder resist layer is formed outside of the power-supply plane in the direction orthogonal to the thickness direction.

* * * * *